United States Patent [19]

Loewenstein

[11] Patent Number: 4,857,140

[45] Date of Patent: Aug. 15, 1989

[54] METHOD FOR ETCHING SILICON NITRIDE

[75] Inventor: Lee M. Loewenstein, Plano, Tex.

[73] Assignee: Texas Instruments Incorporated, Dallas, Tex.

[21] Appl. No.: 175,474

[22] Filed: Mar. 31, 1988

Related U.S. Application Data

[63] Continuation-in-part of Ser. No. 73,937, Jul. 16, 1987, abandoned, and a continuation-in-part of Ser. No. 75,017, Jul. 16, 1987.

[51] Int. Cl.$^4$ .............. B44C 1/22; C03C 15/00; C03C 25/06
[52] U.S. Cl. .................. 156/643; 156/646; 156/653; 156/657; 156/659.1; 204/192.37; 252/79.1; 437/241

[58] Field of Search .............. 252/79.1; 156/643, 646, 156/653, 657, 659.1, 662; 427/38, 39; 204/192.32, 192.37; 437/228, 241

[56] References Cited

U.S. PATENT DOCUMENTS

| | | | |
|---|---|---|---|
| 4,568,410 | 2/1986 | Thornquist | 252/79.1 X |
| 4,615,756 | 10/1986 | Tsujii et al. | 156/643 X |
| 4,687,544 | 8/1987 | Bersin | 156/643 |
| 4,711,698 | 12/1987 | Douglas | 252/79.1 X |

Primary Examiner—William A. Powell
Attorney, Agent, or Firm—Joseph E. Rogers; James T. Comfort; Melvin Sharp

[57] ABSTRACT

A process for etching silicon nitride which utilizes free radicals from a remote plasma generated using a fluorine containing gas; and hydrogen; to produce an etch which is selective to selected materials, for example, silicon and silicon dioxide.

55 Claims, 2 Drawing Sheets

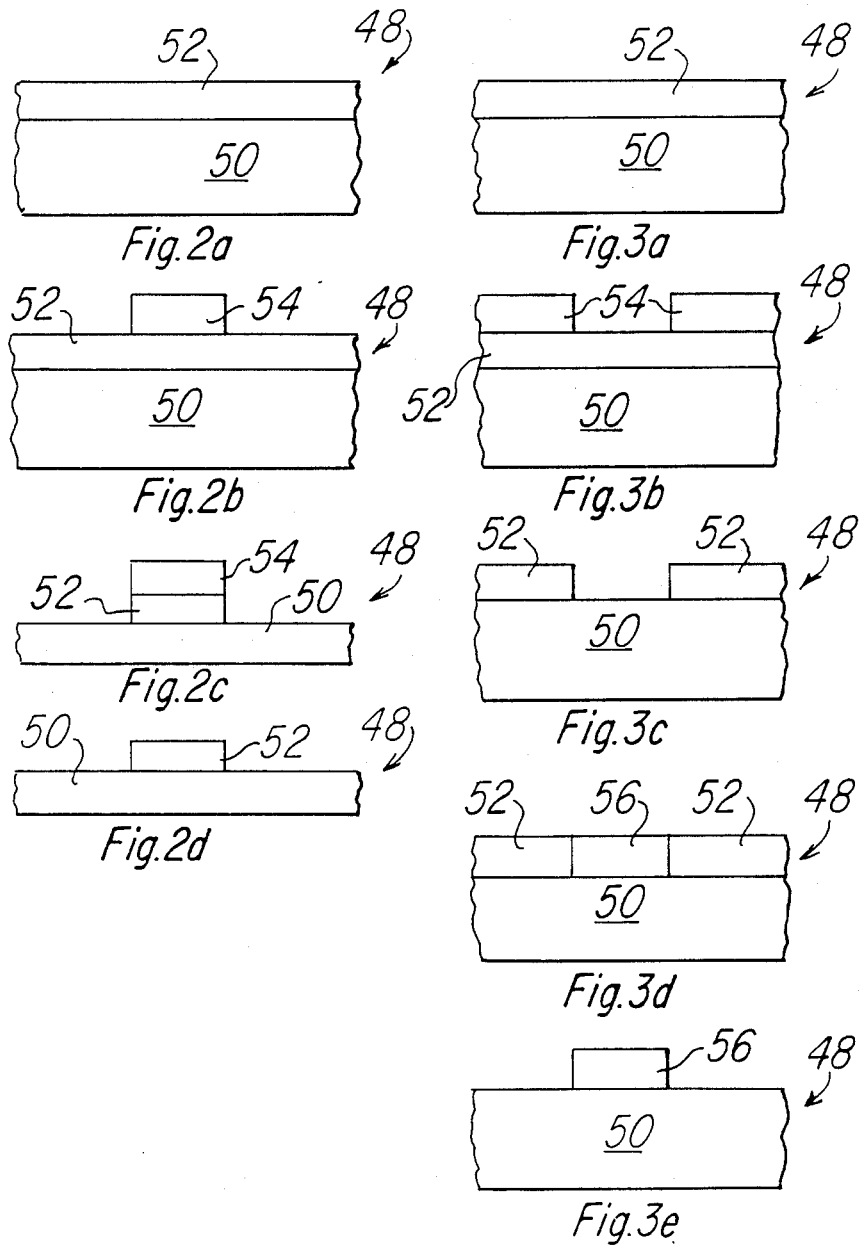

METHOD FOR ETCHING SILICON NITRIDE

CROSS REFERENCE TO RELATED APPLICATIONS

The present application is a continuation in part of applications Ser. Nos. 073,937, now abandoned, and 075,017 dated July 16, 1987.

The present application incorporates by reference each of the following applications which are related cases of a common assignee and contain related subject matter:

Ser. No. 060,991, filed 06/12/87, pending, *Vaccuum Slice Carrier*; which is a continuing application of Ser. No. 790,918, filed 10/24/85 by Davis, Cecil and Matthews, Robert; now abandoned;

Ser. No. 060,976 filed 06/12/87, abandoned, *Advanced Vacuum Processor*; which is a continuing application of Ser. No. 790,708, filed 10/24/85 by Davis, Cecil; Spencer, John; Wooldridge, Tim; and Carter, Duane; now abandoned;

U.S. Pat. No. 4,687,542, issued Aug. 18,1987, entitled *Vacuum Processing System* by Davis, Cecil; Matthews, Robert; and Hildenbrand, Randall;

Ser. No. 790,707, filed 10/24/85, U.S. Pat. No. 4,685,999, entitled *Apparatus for Plasma-Assisted Etching* by Davis, Cecil; Carter, Duane; and Jucha, Rhett;

Ser. No. 061,017, filed 06/12/87, abandoned, entitled *Integrated Circuit Processing System*; which is a continuing application of Ser. No. 824,342, filed 1/30/86, abandoned by Davis, Cecil; Bowling, Robert; and Matthews, Robert; and Ser. No. 915,608, filed 10/06/86, U.S. Pat. No. 4,718,975, entitled *Movable Particle Shield* by Bowling, Robert; Larrabee, Graydon; and Liu, Benjamin;

Ser. No. 074,448, filed 7/16/87, pending, entitled Processing Apparatus and Method; by Davis, Cecil; Matthews, Robert; Loewenstein, Lee; Abernathy, Joe; and Wooldridge, Timothy;

Ser. No. 075,016, filed 7/17/87, pending, entitled *Processing Apparatus and Method*; by Davis, Cecil; Loewenstein, Lee; Matthews, Robert; and Jones, John;

Ser. No. 073,943, filed 7/16/87, pending, entitled *Processing Apparatus and Method*; by Loewenstein, Lee; Rose, Alan; Kennedy, Robert III; Huffman, Craig; and Davis, Cecil;

Ser. No. 073,948, filed 7/16/87, pending, entitled *Processing Apparatus and Method*; by Loewenstein, Lee;

Ser. No. 073,942, filed 7/16/87, pending entitled *Processing Apparatus and Method*; by Jucha, Rhett; and Davis, Cecil;

Ser. No. 074,419, filed 7/16/87, pending, entitled *Processing Apparatus and Method*; by Davis, Cecil; and Matthews, Robert;

Ser. No. 074,377, filed 7/16/87, pending, entitled *Processing Apparatus and Method*; by Davis, Cecil; Jucha, Rhett; Hildenbrand, Randall; Schultz, Richard; Loewenstein, Lee; Matthews, Robert; Huffman, Craig; and Jones, John;

Ser. No. 074,398, filed 7/16/87, abandoned entitled *Processing Apparatus and Method*; by Davis, Cecil; Loewenstein, Lee; Jucha, Rhett; Matthews, Robert; Hildenbrand, Randall; Freeman, Dean; and Jones, John;

Ser. No. 074,456, filed 7/16/87, pending, entitled *Processing Apparatus and Method*; by Davis, Cecil; Jucha, Rhett; Luttmer, Joseph; York, Rudy; Loewenstein, Lee; Matthews, Robert; and Hildenbrand, Randall;

Ser. No. 074,399, filed 7/16/87, abandoned, entitled *Processing Apparatus and Method*; by Jucha, Rhett; and Davis, Cecil;

Ser. No. 074,450, filed 7/16/87, pending, entitled *Processing Apparatus and Method*; by Jucha, Rhett; Davis, Cecil; and Jones, John;

Ser. No. 074,375, filed 7/16/87, pending, entitled *Processing Apparatus and Method*; by Jucha, Rhett; Carter, D.; Davis, Cecil; and Crank S.;

Ser. No. 074,411, filed 7/16/87, pending, entitled *Processing Apparatus and Method*; by Jucha, Rhett; Davis, Cecil; Carter, D.; Crank, S.; and Jones, John;

Ser. No. 074,390, filed 7/16/87, abandoned, entitled *Processing Apparatus and Method*; by Jucha, Rhett; Davis, Cecil; and Crank S.;

Ser. No. 074,114, filed 7/16/87, abandoned, entitled *Processing Apparatus and Method*; by Davis, Cecil; Loewenstein, Lee; Freeman, Dean; and Burris, James;

Ser. No. 074,373, filed 7/16/87, pending, entitled *Processing Apparatus and Method*; by Freeman, Dean; Burris, James; Davis, Cecil; and Loewenstein, Lee;

Ser. No. 074,391, filed 7/16/87, pending, entitled *Processing Apparatus and Method*; by Freeman, Dean; Burris, James; Davis, Cecil; and Loewenstein, Lee;

Ser. No. 074,415, filed 7/16/87, pending, entitled *Processing Apparatus and Method*; by Freeman, Dean; Burris, James; Davis, Cecil; Loewenstein, Lee;

Ser. No. 074,451, filed 7/16/87, pending, entitled *Processing Apparatus and Method*; by Luttmer, Joseph; Davis, Cecil; Smith, Patricia; York, Rudy; Loewenstein, Lee; and Jucha, Rhett;

Ser. No. 073,945, filed 7/16/87, pending, entitled *Processing Apparatus and Method*; by Luttmer, Joseph, Davis, Cecil; Smith, Patricia; and York, Rudy;

Ser. No. 073,936, filed 7/16/87, abandoned, entitled *Processing Apparatus and Method*; by Luttmer, Joseph, Davis, Cecil; Smith, Patricia; and York, Rudy;

Ser. No. 074,111, filed 7/16/87, abandoned, entitled *Processing Apparatus and Method*; by Luttmer, Joseph, York, Rudy; Smith, Patricia; and Davis, Cecil;

Ser. No. 074,386, filed 7/16/87, pending, entitled *Processing Apparatus and Method*; by York, Rudy; Luttmer, Joseph; Smith, Patricia; and Davis, Cecil;

Ser. No. 074,407, filed 7/16/87, abandoned, entitled *Processing Apparatus and Method*; by York, Rudy; Luttmer, Joseph; Smith, Patricia; and Davis, Cecil;

Ser. No. 075,018, filed 7/16/87, pending, entitled *Processing Apparatus and Method*; by Davis, Cecil; Abernathy, Joe; Matthews, Robert; Hildenbrand, Randall; Simpson, Bruce; Bohlman, James; Loewenstein, Lee; and Jones, John;

Ser. No. 074,112, filed 7/16/87, pending, entitled *Processing Apparatus and Method*; by Davis, Cecil; Matthews, Robert; York, Rudy; Luttmer, Joseph; Jakubik, Dwain; and Hunter, James;

Ser. No. 074,449, filed 7/16/87, pending, entitled *Processing Apparatus and Method*; by Davis, Cecil; Smith, Greg; Matthews, Robert; Jones, John; Smith, James; and Schultz, Richard;

Ser. No. 074,406, filed 7/16/87, abandoned, entitled *Processing Apparatus and Method*; by Davis, Cecil; Freeman, Dean; Matthews, Robert; Tomlin, Joel;

Ser. No. 073,941, filed 7/16/87, pending, entitled *Processing Apparatus and Method*; by Davis, Cecil; Loewenstein, Lee; Tipton, Charlotte; Smith, Randy, Pohlmeier, R.; Jones, Bowling, Robert; and Russell, I;

Ser. No. 074,371, filed 7/16/87, pending, entitled *Processing Apparatus and Method*; by Loewenstein, Lee; and Davis, Cecil;

Ser. No. 074,418, filed 7/16/87, abandoned, entitled *Processing Apparatus and Method*; by Fisher, Wayne;

Ser. No. 073,934, filed 7/16/87, abandoned, entitled *Processing Apparatus and Method*; by Fisher, Wayne; Bennett, Tommy; Davis, Cecil; and Matthews, Robert;

Ser. No. 074,403, filed 7/16/87, abandoned, entitled *Processing Apparatus and Method*; by Davis, Cecil; Matthews, Robert; and Fisher, Wayne;

Ser. No. 075,019, filed 7/17/87, pending, entitled *Processing Apparatus and Method*; by Davis, Cecil; Freeman, Dean; Matthews, Robert; and Tomlin, Joel;

Ser. No. 073,939, filed 7/16/87, abandoned, entitled *Processing Apparatus and Method*; by Davis, Cecil; Abernathy, Joe; Matthews, Robert, Hildenbrand, Randy; Simpson, Bruce; Bohlman, James; Loewenstein, Lee; and Jones, John;

Ser. No. 073,944, filed 7/16/87, pending, entitled *Processing Apparatus and Method*; by Cecil, Davis and Jucha, Rhett;

Ser. No. 073,935, filed 7/16/87, abandoned, entitled *Processing Apparatus and Method*; by Liu, Jiann; Davis, Cecil; and Loewenstein, Lee;

Ser. No. 074,129, filed 7/16/87, pending, entitled *Processing Apparatus and Method*; by Loewenstein, Lee; Freeman, Dean; and Davis, Cecil;

Ser. No. 074,455, filed 7/16/87, pending, entitled *Processing Apparatus and Method*; by Loewenstein, Lee; Freeman, Dean; and Davis, Cecil;

Ser. No. 074,453, filed 7/16/87, pending, entitled *Processing Apparatus and Method*; by Loewenstein, Lee; Freeman, Dean; and Davis, Cecil;

Ser. No. 073,949, filed 7/16/87, abandoned, entitled *Processing Apparatus and Method*; by Loewenstein, Lee; and Davis, Cecil;

Ser. No. 074,379, filed 7/16/87, pending, entitled *Processing Apparatus and Method*; by Loewenstein, Lee; and Davis, Cecil;

Ser. No. 074,425, filed 7/16/87, abandoned, entitled *Processing Apparatus and Method*; by Loewenstein, Lee; Davis, Cecil; and Jucha, Rhett;

Ser. No. 073,947, filed 7/16/87, abandoned, entitled *Processing Apparatus and Method*; by Davis, Cecil; Loewenstein, Lee; and Jucha, Rhett;

Ser. No. 074,452, filed 7/16/87, abandoned, entitled *Processing Apparatus and Method*; by Jucha, Rhett; Davis, Cecil; and Loewenstein, Lee;

Ser. No. 074,454, filed 7/16/87, abandoned, entitled *Processing Apparatus and Method*; by Jucha, Rhett; Davis, Cecil; and Loewenstein, Lee;

Ser. No. 074,422, filed 7/16/87, pending, entitled *Processing Apparatus and Method*; by Davis, Cecil; Matthews, Robert; Jucha, Rhett; and Loewenstein, Lee;

Ser. No. 074,113, filed 7/16/87, pending, entitled *Processing Apparatus and Method*; by Davis, Cecil; Matthews, Robert; Loewenstein, Lee; Jucha, Rhett; Hildenbrand, Randy; and Jones, John;

Ser. No. 073,940, filed 7/16/87, pending, entitled *Processing Apparatus and Method*; by Davis, Cecil; and Matthews, Robert;

Ser. No. 073,946, filed 7/16/87, pending, entitled *Processing Apparatus and Method*; by Davis, Cecil; and Matthews, Robert; and Ser. No. 073,938, filed 7/16/87, abandoned, entitled *Processing Apparatus and Method*; by Davis, Cecil; and Matthews, Robert;

Ser. No. 122,605, filed 11/17/87, pending, entitled *Processing Apparatus and Method*; by Jucha, Rhett; Davis, Cecil; and Loewenstein, Lee;

Ser. No. 117,707, filed 11/05/87, pending, entitled *Processing Apparatus and Method*; by Freeman, Dean; and Burris, James;

Ser. No. 117,708, filed 11/05/87, pending, entitled *Processing Apparatus and Method*; by Freeman, Dean; and Burris, James; and Ser. No. 174,649, filed 3/29/88, entitled *Processing Apparatus and Method*; by Jucha, Rhett; Davis, Cecil; Tang, Thomas; and Loewenstein, Lee.

BACKGROUND OF THE INVENTION

1. Field Of The Invention

The present invention relates to a method of manufacturing integrated circuits and other electronic devices. More particularly, the invention relates to an improved process for the etching of silicon nitride on a semiconductor wafer.

2. Description Of The Related Art

Deposited films are used widely in the fabrication of VLSI circuits. These films provide, inter alia, electrical insulation between metals and protection from the environment. One of the materials used in these films is silicon nitride. Silicon nitride is a barrier to sodium diffusion, is nearly impervious to moisture and has a very low oxidation rate.

An etching process is generally used in semiconductor manufacture to transfer resist patterns to circuit features. In particular, etching of silicon nitride is generally accomplished using liquid reagents (e.g., phosphoric acid). This is called a "wet etch." This "wet etch" procedure had inherent problems and limitations given the state of the art for producing VLSI circuits, one of which is related to particulate contamination of the etchant.

One of the problems is that defects are caused by the presence of particulates. This problem is becoming more and more troublesome because of two trends in integrated circuit processing. First, as device dimensions become smaller and smaller, the size of a fatal defect becomes smaller, so that it is necessary to avoid the presence of smaller and smaller particles. Second, there is an increased desire to use large size integrated circuits.

Thus, particulates are not only an increasingly important source of loss in integrated circuit manufacturing yields. Current wet processing steps in integrated circuit manufacture may, therefore, not be viable in the coming years because the liquid reagents generally contain particulates. Contamination of the liquid reagents requires that these chemicals be replaced often, resulting in an expensive waste disposal problem. In addition, many of the liquid reagents used are quite hazardous to human workers process facilities.

Silicon nitride stripping using, for example, phosphoric acid has the problems discussed above. In particular, the process results in particulate and metal contamination which requires future additional cleanup steps. The phosphoric acid used in the stripping process is quite hazardous to human workers and its frequent replacement result in an expensive waste disposal problem.

In addition to the problems of wet etch, there are other etch considerations which must be addressed. It is well known that each material on the substrate exposed to the etch chemistry has a finite each rate. A parameter of considerable importance in pattern transfer is selectivity. Selectivity is defined as the ratio of etch rates between different materials and selectivity with respect to the etch mask has an impact on feature size control. Selectivity with respect to the substrate affects the yield and performance. Therefore, selectivity between the silicon nitride and other exposed materials is a very important consideration when considering any etch process.

SUMMARY OF THE INVENTION

Described herein is a process for the etch of a silicon nitride film comprising the steps of: generating at least free radicals from a gas containing a fluorine source in a plasma generator remote from a process chamber; adding a source of hydrogen to said free radicals to form a gas mixture; and introducing said gas mixture to said film.

It has been found useful to use, for example, either $CF_4$, $F_2$, $C_2F_6$, $CHF_3$, and $SF_6$ singly or in combination as a fluorine source. It has also been found useful to use, for example, either $CH_4$, $H_2$, $NH_3$, a hydrocarbon or any molecule with an abstractable hydrogen atom as a hydrogen source.

The advantages are set forth within and toward the end of the description of the preferred embodiment.

BRIEF DESCRIPTION OF THE DRAWINGS

The invention is illustrated in the accompanying drawings, wherein:

FIGS. 2(a)-(d) show a semiconductor wafer at intermediate manufacturing steps.

FIGS. 3(a)-(e) show a semiconductor wafer at intermediate manufacturing steps.

DESCRIPTION OF THE PREFERRED EMBODIMENT

Figure 1:
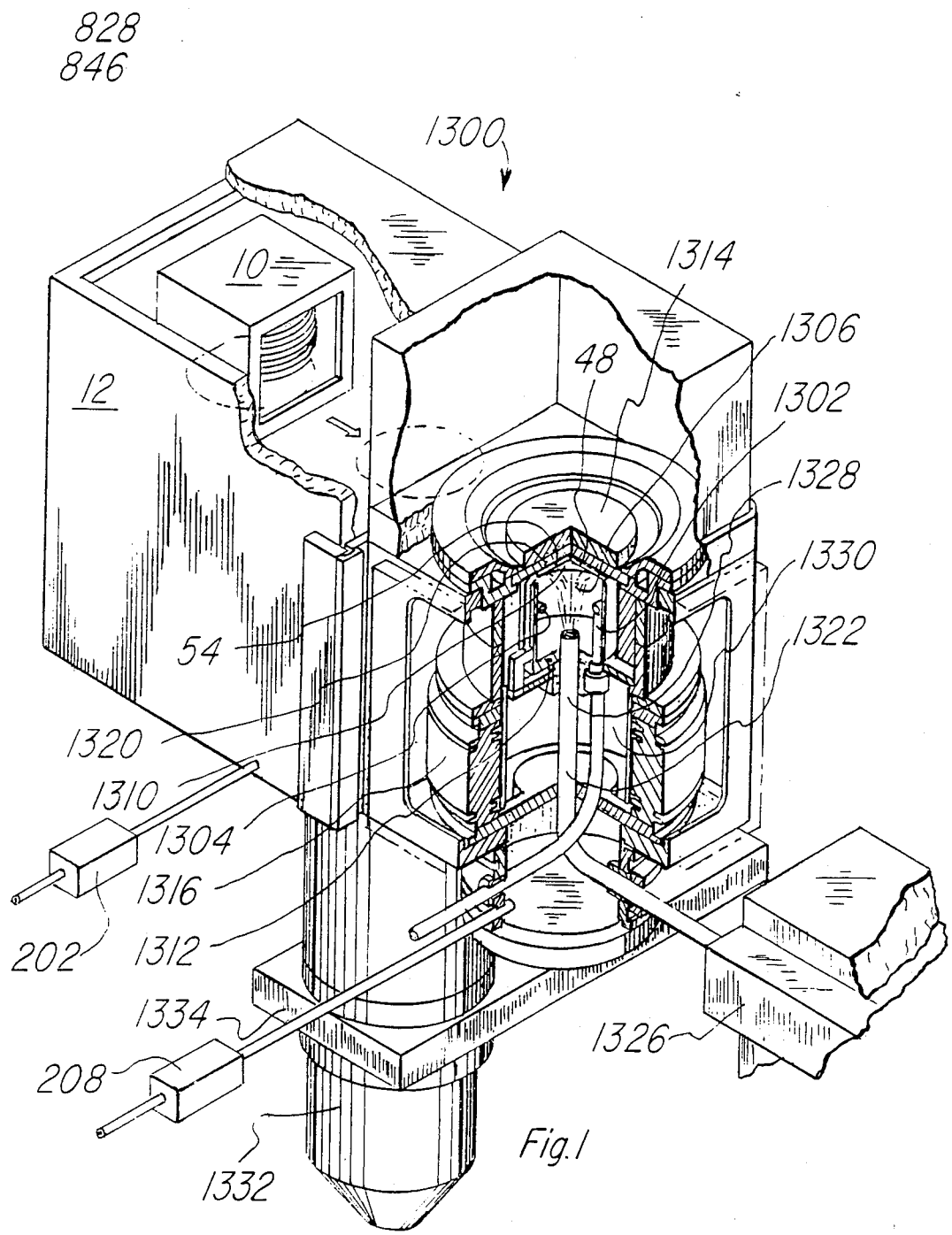
FIG. 1 shows an embodiment which includes a remote microwave plasma and an in situ plasma capability for process enhancement.

The present invention can be practiced using a processing module described in U.S. patent application Ser. No. 074,415, filed July 16, 1987, which is incorporated by reference, or any other process module capable of providing plasma products, i.e. predominantly free radicals, and generating an in situ plasma from those free radicals. Modules which provide free radicals and no in situ plasma can also be used. An example of a processing module that can be used to perform this process is shown in FIG. 32 of that application and is described in the specification. FIG. 1 of this application is identical to FIG. 32 of the incorporated patent application and shows a process module having the capability to produce both an in situ plasma and to provide free radicals from a remote plasma generator for performing the present invention.

Referring to FIG. 1, a process module 1300 is shown. This process module has remote and in situ plasma capability. The wafer carrier 10, a transfer arm (not shown) and chamber 12 are utilized to transfer the wafer 48 from the carrier 10 to the process module 1300. Module 1300 is shown with a gas distributor 1302 attached to a gas distribution ring 1304 which is located in the upper part of top process chamber 1306. The gas distributor 1304 can supply a second gas mixture to the process module. The ring 1304 is arranged about the vertical axis of the chamber 1306. The gas exits from ring 1304 through a plurality of openings 1310 in the bottom of ring 1304. The vertical walls of chamber 1306 can be made of quartz and form a cylinder about the vertical axis of chamber 1306. The bottom of chamber 1306 is an electrode 1312. The top of chamber 1306 in the closed position is an electrode 1314. A heat exchanger (not shown) can be provided for electrode 1314, if desired, for example, to maintain an ambient temperature of, for example, 25 degrees C.

The chamber 1306 is opened and closed by a bellows 1316. The bellows 1316 moves the vertical walls of chamber 1306 upward and into contact with the electrode 1314 or an adjacent portion of module 1300. A seal (not shown) can be provided at the location where the vertical wall of chamber 1306 comes into contact with electrode 1314 or an adjacent portion of module 1300. The bellows moves the chamber 1306 upward to close the chamber and downward to open the chamber. In the open position the arm can transfer the wafer 48 from the carrier through chamber 12 and into the chamber 1306 onto fingers or pins 1320. When the chamber 1306 is closed, the fingers 1320 move upward to place the wafer 48 into contact with electrode 1314.

The remote plasma is supplied into the bottom of chamber 1306 along the vertical axis through a pipe 1322. Pipe 1322 extends from a remote plasma generator 1326 and through electrode 1312 into chamber 1306. The pipe 1322 has a slip fit 1328 with electrode 1312 to accommodate the vertical movement of chamber 1306 including that of electrode 1312. Below electrode 1312 is located a chamber 1330 which is connected to pump 1332 and valve 1334. Thus a generally downward flow of gas through chambers 1306 and 1330 is provided. The in situ plasma is provided by the application of appropriate voltages between electrodes 1312 and 1314. The voltage would be RF to provide the desired excitation to the gas in chamber 1306. Pump 1332 and valve 1334 provide the desired vacuum within chamber 1306. This the remote plasma from generator 1326 and the in situ plasma generated within the chamber 1306 are joined in acting on face 54. The distributor 1302 also has a slip fit with electrode 1312. Distributor 1302 extends along the vertical wall of chamber 1306. The process module 1300 is adapted to perform various processes.

After the desired operation is finished, the gas supplied through pipe 1322 is cut off, and the process module 1300 is pumped down to the same pressure as the rest of the process module ($10^{-3}$ Torr or less). A holding time may then be interposed, for thermal stabilization of the process module or for release of possible suspended particulates, and then the process module 1300 is opened and a transfer arm (not shown) removes the wafer from chamber 12.

Module 1300 includes the capability for process enhancement by in situ plasma and the capability is also provided for providing activated species, generated by gas flows through an additional plasma discharge which is remote from the wafer face to the wafer face. The module is shown in a process station 1300 which includes only one module and one vacuum load lock, but can also be used in embodiments where a central handling chamber is combined with plural process modules 1300 and one or more vacuum load lock chambers 12.

Note that a particulate sensor 202 is explicitly shown connected to the interior of the vacuum load lock chamber 12. This particulate sensor 202 need not be physically located very close to the docking position of vacuum wafer carrier 10, as long as the signal from particulate sensor 202 does provide an indication of the level of particulates present in the interior of the vacuum load lock chamber 12. The particulate sensor 202 is usefully located downstream from the vacuum load lock 12, in the pump out path (not shown). The particle sensor is, for example, a commercially available laser particle counter (which detects individual particles) combined with a counter which provides an output signal showing the number of particles counted over a certain time duration.

Module 1300 can perform processes for the etching of silicon nitride which is part of the overall process for manufacturing semiconductor devices. These processes are described in detail hereinafter.

FIG. 2(a) shows a cross sectional view of a semiconductor wafer at intermediate manufacturing step. Wafer 48 is shown as being comprised of layer 50 which could be, for example, crystalline silicon, and silicon nitride layer 52 atop layer 50. FIG. 2(b) shows a patterned layer of photoresist 54 atop layer 52. The method for patterning photoresist is well known in the art.

Module 1300, described above, and shown in FIG. 1 can then be used to etch the unmasked portions of the silicon nitride layer 52 on wafer 48 as shown in FIG. 2(b) while providing improved selectivity to the photoresist and to layer 50.

Vacuum wafer carrier 10 containing wafer 48 is placed into chamber 12. Chamber 12 is then pumped to a vacuum and the door (not shown) to vacuum wafer carrier 10 is then opened. A transfer arm (not shown) then removes the wafer 48 from the carrier and moves it to the process chamber 1306. Wafer 48 is placed on fingers 1320 by the transfer arm. The transfer arm is retracted from the process chamber 1306 and wafer 48 is placed in contact with electrode 1314 or an adjacent portion of process module 1300 as chamber 1306 closed by bellows 1316 as described above. The desired process gasses, e.g. fluorine sources and hydrogen, are turned on. The remote plasma generator 1326 is activated and free radicals generated by it flow from the generator 1326 through pipe 1322 into chamber 1306 and to the face of the wafer 48. Radio frequency voltage can be impressed across electrodes 1312 and 1314 if desired, thereby generating an in-situ plasma within the process chamber 1306 from the free radicals from pipe 1322. If desired, an inert gas can be supplied via gas distributor ring 1304. When the desired etch is complete, the power to the electrodes 1312 and 1314 and to the plasma generator 1326 is turned off and the gas flow to pipe 1322 is stopped. The results of this etch are depicted in FIG. 2(c). The remaining photoresist layer 54 can then be removed by process well known in the art either in the same module 1300, (or, e.g., in another well known processing step after the wafer is removed from the module 1300) as shown in FIG. 2(d). When the desired processing within module is complete, the bellows 1316 moves downward thereby opening the process chamber as described above, thus allowing the transfer arm to enter the process chamber 1306 and retrieve wafer 48 as described above. The transfer arm then returns the wafer 48 to the vacuum wafer carrier 10 in chamber 12 as described above.

Several useful gas mixtures using fluorine sources with helium and hydrogen and remote plasma and, if desired, in situ plasma has been shown to improve etch rate over the sum of the rates of in situ and remote plasma used separately and to provide selectivity between silicon nitride and other selected materials, e.g., silicon and silicon dioxide.

FIGS. 3(a)–(e) show a semiconductor wafer at intermediate manufacturing steps.

FIG. 3(a) shows a cross sectional view of a semiconductor wafer at another series of intermediate manufacturing steps. Wafer 48 is shown as being comprised of layer 50 which could be, for example, crystalline silicon, and silicon nitride layer 52 atop layer 50. FIG. 3(b) shows a patterned layer of photoresist 54 atop layer 52. The method for patterning photoresist is well known in the art.

Module 1300, described above, and shown in FIG. 1 using both remote and in situ plasmas can be used to etch the unmasked portions of the silicon nitride layer 52 on wafer 48 as shown in FIG. 3(c) while providing improved selectivity to the photoresist and to layer 50. The procedures described above with respect to FIGS. 2(a)–(d) or other procedures that are well known in the art may be used to perform the patterned etching of silicon nitride layer 52.

An oxide layer 56 can then be formed on layer 50, if desired, using techniques well known in the art, e.g. the local oxidation of silicon method (LOCOS) as shown in FIG. 3(d).

The remaining nitride layer 52, shown in FIG. 3(d) can then be removed using the processes described above with regard to FIGS. 2(a)–(d) except that an in situ plasma need not be used, unless desired, leaving the desired oxide layer 56 on substrate 50 as shown in FIG. 3(e).

Several useful gas mixtures using fluorine sources with helium and hydrogen and remote plasma and, if desired, in situ plasma has been shown to improve etch rate over the sum of the rates of in situ and remote plasma used separately and to provide selectivity between silicon nitride and other selected materials, e.g., silicon and silicon dioxide.

One useful process which yielded acceptable results while etching the silicon nitride layer 52 using module 1300 used a remote plasma generator operating at 2450 MHz. The gasses used were Helium at 500 sccm, $CF_4$ at 210 sccm, and $H_2$ at 30 sccm. The pressure can be 0.45 Torr and the temperature 200°. The $CF_4$ and helium gasses were passed through the remote plasma generator 1326. This combination resulted in an etch that was both isotropic and selective. The etch rates and selectivities may be controlled by varying the microwave power and by, if desired, adding and if desired, varying RF power in the process chamber if desired, and by modifying the pressure, temperature and gas mixtures.

Another useful process which yielded acceptable results while etching the silicon nitride layer 52 used module 1300 a remote plasma generator operating watts at 2450 MHz. The gas flows were Helium at 2200 sccm, $SF_6$ at 27.5 sccm and $H_2$ at 68 sccm. The pressure can be 0.95 Torr and the temperature 200° C. The $SF_6$ and helium gasses were passed through the remote plasma generator 126. Other combinations of $SF_6$ and He flow rates with other pressures and temperatures might make higher hydrogen flow rates acceptable. It is also noteworthy that the elimination of the hydrogen, while increasing the etch rates, reduces the selectivities.

Furthermore, the hydrogen can optionally bypass the remote microwave plasma generator 1326. This will increase selectivity but will reduces the etch rate as compared to that found for passing the hydrogen through the microwave plasma generator 1326.

Other fluorine sources, such as $F_2$, $C_2F_6$, $NF_3$, $SF_6$, and $CHF_3$ may be used alone or in combination with He and hydrogen.

Other hydrogen sources, such as $C_2H_4$ and $NH_3$, and other hydrocarbons or any molecule with an abstractable hydrogen may be used as a hydrogen source. In addition, other inert carriers include argon or nitrogen.

Unless specifically stated otherwise above the power and frequencies used for RF and MW plasma can be widely varied, as can the other process parameters. The term low pressure as used herein indicates a pressure which is less than ambient pressure.

Although silicon examples are shown herein, wafers made of other materials such as germanium, etc. can also be etched. The wafers can be comprises of many different configurations, for example, a single piece of crystal material or small crystals located on a larger substrate. The plasma produced as disclosed herein will include free radicals. Although wafers such as wafer 48 are disclosed herein other types of flat workpieces could be used with the techniques disclosed herein.

The result of processing the wafer 48 can be electronic devices, for example, integrated circuits or discrete semiconductor devices. Once the processing is completed the wafers are divided into devices. The circuits and devices are enclosed into packages, for example, as shown in U.S. Pat. Nos. 4,465,898 issued to Orcutt et al on Aug. 14, 1984 and 3,439,238 issued to Birchler et al on Apr. 15, 1969, which are incorporated hereinto by reference. These packages are then utilized in the construction of printed circuit boards. The printer circuits boards, which cannot operate without the packaged integrated circuits and devices to perform their intended functions, are the required electrical components within computers, photocopiers, printers, telecommunication equipment, calculators, and all of the other electronic equipment which are an essential ingredients of the electronic and information age. Thus electronic equipment cannot function without the circuits and devices.

The present application describes a processing method, which contains numerous additional features which serve to provide further advantages.

It is an advantage of the present invention to provide a process for etch of silicon nitride which minimizes surface damage while improving the etch rate.

It is an advantage of the present invention to provide a process for etch of silicon nitride which is isotropic utilizing remote plasmas and provides increased selectivity between silicon nitride and other materials.

Having described the invention in connection with certain specific embodiments thereof, it is to be understood that further modifications may now suggest themselves to those skilled in the art, it is intended to cover all such modifications as fall within the scope of the appended claims.

What is claimed is:

1. A process for etch of a silicon nitride film comprising the steps of:
   (a) generating at least free radicals from a gas containing at least a fluorine source in a plasma generator remote from a process chamber; and
   (b) introducing said gas mixture and a source of hydrogen.

2. The process as set forth in claim 1 wherein said source of hydrogen is added to said gas inside said process chamber.

3. The process as set forth in claim 1 wherein said source of hydrogen is added to said gas before generating said at least free radicals.

4. The process as set forth in claim 1 wherein said source of hydrogen is added to said gas after generating said at least free radicals.

5. The process as set forth in claim 1 wherein the fluorine source is taken from the group of $CF_4$, $F_2$, $SF_6$ and $C_2F_6$ singly or in combination.

6. The process as set forth in claim 1 wherein the fluorine source is $CF_4$.

7. The process as set forth in claim 1 wherein the fluorine source is $SF_6$.

8. The process as set forth in claim 1 wherein the hydrogen source is taken from the group of $CH_4$, $H_2$, $NH_3$, hydrocarbon or any molecule with an abstractable hydrogen atom.

9. The process as set forth in claim 1 wherein the Fluorine source is taken from the group of $CF_4$, $F_2$, $SF_6$, $C_2F_6$, $NF_3$, and $CHF_3$ singly or in combination.

10. The process as set forth in claim 1 wherein the process is carried out at 200° C.

11. The process as set forth in claim 1 wherein the low pressure is 1 Torr and wherein the mixture has a flow comprised of helium at 2200 sccm, hydrogen at 30 sccm, and $CF_4$ at 210 sccm.

12. The process as set forth in claim 1 wherein the low pressure is 0.45 Torr and wherein the mixture has a flow comprised of Helium at 500 sccm, hydrogen at 30 sccm, and $CF_4$ at 210 sccm.

13. The process as set forth in claim 1 wherein the low pressure is 0.915 Torr and wherein the mixture has a flow comprised of Helium at 2200 sccm, hydrogen at 68 sccm, and $SF_6$ at 27.5 sccm.

14. A process for etch of a Silicon Nitride film comprising the steps of:
   (a) disposing said film in a low pressure process chamber;
   (b) generating at least free radicals from a gas comprised of a gas taken from the group of $CF_4$, $F_2$, $SF_6$, $CFH_3$, and $C_2F_6$ and an inert carrier taken from the group of helium, argon, or nitrogen; and
   (c) introducing said gas and a source of hydrogen taken from the group of $CH_4$, $H_2$, $NH_3$, hydrocarbon or any molecule with an abstractable hydrogen atom to said film.

15. The process as set forth in claim 14 wherein said source of hydrogen is added to said gas inside said process chamber.

16. The process as set forth in claim 14 wherein said source of hydrogen is added to said gas before generating said at least free radicals.

17. The process as set forth in claim 14 wherein said source of hydrogen is added to said gas after generating said at least free radicals.

18. The process as set forth in claim 14 wherein the process is carried out at 200° C.

19. The process as set forth in claim 14 wherein the low pressure is 1 Torr and wherein the mixture has a flow comprised of Helium at 2200 sccm, hydrogen at 30 sccm, and $CF_4$ at 210 sccm.

20. The process as set forth in claim 14 wherein the low pressure is 0.45 Torr and wherein the mixture has a flow comprised of Helium at 500 sccm, hydrogen at 30 sccm, and $CF_4$ at 210 sccm.

21. The process as set forth in claim 14 wherein the low pressure is 0.915 Torr and wherein the mixture has a flow comprised of Helium at 2200 sccm, hydrogen at 68 sccm, and $SF_6$ at 27.5 sccm.

22. A process for etch of a silicon nitride film comprising the steps of:
   (a) generating at least free radical from a gas containing $SF_6$ in a plasma generator remote from a process chamber; and
   (b) introducing said gas and source of hydrogen to said film.

23. The process as set forth in claim 22 wherein said source of hydrogen is added to said gas inside said process chamber.

24. The process as set forth in claim 22 wherein said source of hydrogen is added to said gas before generating said at least free radicals.

25. The process as set forth in claim 22 wherein said source of hydrogen is added to said gas after generating said at least free radicals.

26. The process as set forth in claim 22 wherein at least one taken from the group of $CF_4$, $F_2$, and $C_2F_6$ is added to said gas.

27. The process as set forth in claim 22 wherein the hydrogen source is taken from the group of $CH_4$, $H_2$, $NH_3$, $CHF_3$, hydrocarbon or any molecule with an abstractable hydrogen atom.

28. The process as set forth in claim 22 wherein at least one taken from the group of $CF_4$, $F_2$, $C_2F_6$, $NF_3$, and $CHF_3$ is added to said gas.

29. The process as set forth in claim 22 wherein the process is carried out at 200° C.

30. The process as set forth in claim 22 wherein the low pressure is 0.915 Torr and wherein the mixture has a flow comprised of Helium at 2200 sccm, hydrogen at 68 sccm, and $SF_6$ at 27.5 sccm.

31. The process as set forth in claim 22 further including a cleanup of the process chamber using free radicals generated in a plasma generator remote from the process chamber.

32. A process for etch of a Silicon Nitride film comprising the steps of:
   (a) disposing said film in a low pressure process chamber;
   (b) generating at least free radicals from a gas comprised of $SF_6$ and an inert carrier in a plasma generator remote from said process chamber;
   (c) introducing said gas and a source of hydrogen and to said film; and
   (d) generating an insitu plasma from said gas and said source of hydrogen.

33. The process as set forth in claim 32 wherein said source of hydrogen is added to said gas inside said process chamber.

34. The process as set forth in claim 32 wherein said source of hydrogen is added to said gas before generating said at least free radicals.

35. The process as set forth in claim 32 wherein said source of hydrogen is added to said gas after generating said at least free radicals.

36. The process as set forth in claim 32 wherein at least one take from the group of $CF_4$, $F_2$, and $C_2F_6$ is added to said gas.

37. The process as set forth in claim 32 wherein the hydrogen source is taken from the group of $CH_4$, $H_2$, $NH_3$, hydrogen or any molecule with an abstractable hydrogen atom.

38. The process as set forth in claim 32 wherein the inert carrier is taken from the group of helium, argon, or nitrogen.

39. The process as set forth in claim 32 wherein at least one taken from the group of $CF_4$, $F_2$, $C_2F_6$, $NF_3$, and $CHF_3$ is added to said gas.

40. A process for etch of a Silicon Nitride film comprising the steps of:
   (a) generating at least free radicals from a gas comprised of $SF_6$ and an inert carrier in a plasma generator remote from a process chamber; and
   (b) introducing said gas and a source of hydrogen into said chamber and to said film.

41. The process as set forth in claim 40 wherein said source of hydrogen is added to said gas inside said process chamber.

42. The process as set forth in claim 40 wherein said source of hydrogen is added to said gas before generating said at least free radicals.

43. The process as set forth in claim 40 wherein said source of hydrogen is added to said gas after generating said at least free radicals.

44. The process as set forth in claim 40 wherein at least one taken from the group of $CF_4$, $F_2$, and $C_2F_6$ is added to said gas.

45. The process as set forth in claim 40 wherein at least one taken from the group of $CF_4$, $F_2$, $C_2F_6$, $NF_3$, and $CHF_3$ is added to said gas.

46. The process as set forth in claim 40 wherein the hydrogen source is taken from the group of $CH_4$, $H_2$, $NH_3$, hydrocarbon or any molecule with an abstractable hydrogen atom.

47. The process as set forth in claim 40 wherein the inert carrier is taken from the group of helium, argon, or nitrogen.

48. The process as set forth in claim 40 wherein the process is carried out at 200° C.

49. The process as set forth in claim 40 wherein the low pressure is 0.915 Torr and wherein the mixture has flow comprised of Helium at 2200 sccm, hydrogen at 68 sccm, and $SF_6$ at 27.5 sccm.

50. A process for etch of a Silicon Nitride film comprising the steps of:
   (a) generating at least free radicals from a gas comprised of $SF_6$ and a gas taken from the group of $CF_4$, $F_2$, and $C_2F_6$ and an inert carrier taken from the group of helium, argon, or nitrogen in a plasma generator remote from the process chamber; and
   (b) introducing said gas and a source of hydrogen taken from the group of $CH_4$, $H_2$, $NH_3$, hydrocarbon or any molecule with an abstractable hydrogen atom said film.

51. The process as set forth in claim 50 wherein said source of hydrogen is added to said gas inside said process chamber.

52. The process as set forth in claim 50 wherein said source of hydrogen is added to said gas before generating said at least free radicals.

53. The process as set forth in claim 50 wherein said source of hydrogen is added to said gas after generating said at least free radicals.

54. The process as set forth in claim 50 wherein the process is carried out at 200° C.

55. The process as set forth in claim 50 wherein the low pressure is 0.915 Torr and wherein the mixture has a flow comprised of Helium at 2200 sccm, hydrogen at 68 sccm, and $SF_6$ at 27.5 sccm.

* * * * *